(12) United States Patent
Peethala et al.

(10) Patent No.: US 9,378,966 B2
(45) Date of Patent: Jun. 28, 2016

(54) SELECTIVE ETCHING OF SILICON WAFER

(71) Applicant: International Business Machines Corporation, Armonk, NY (US)

(72) Inventors: Brown C. Peethala, Albany, NY (US); Spyridon Skordas, Troy, NY (US); Da Song, Loudonville, NY (US); Allan Upham, Waterford, NY (US); Kevin R. Winstel, East Greenbush, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/300,679

(22) Filed: Jun. 10, 2014

(65) Prior Publication Data

US 2015/0357197 A1 Dec. 10, 2015

(51) Int. Cl.
| | | |
|---|---|---|
| *H01L 21/306* | (2006.01) | |
| *H01L 21/67* | (2006.01) | |
| *C09K 13/08* | (2006.01) | |
| *H01L 29/167* | (2006.01) | |

(52) U.S. Cl.
CPC .......... *H01L 21/30604* (2013.01); *C09K 13/08* (2013.01); *H01L 21/6708* (2013.01); *H01L 29/167* (2013.01)

(58) Field of Classification Search
CPC ............... H01L 21/3065; H01L 21/76283; H01L 21/76232
See application file for complete search history.

(56) References Cited

U.S. PATENT DOCUMENTS

| | | | |
|---|---|---|---|
| 4,681,657 A * | 7/1987 | Hwang | H01L 21/30604 252/79.3 |
| 5,518,966 A | 5/1996 | Woo | |
| 5,961,877 A | 10/1999 | Robinson et al. | |
| 8,048,807 B2 | 11/2011 | Liu et al. | |
| 8,158,506 B2 | 4/2012 | Kim et al. | |
| 2007/0281488 A1* | 12/2007 | Wells | H01L 21/3065 438/705 |
| 2009/0141583 A1* | 6/2009 | Fanjat | G05D 11/133 366/140 |
| 2011/0104480 A1 | 5/2011 | Malekos et al. | |
| 2013/0137277 A1 | 5/2013 | Huang | |

OTHER PUBLICATIONS

Milind et al. (Acid-Based Etching of Silicon Wafers: Mass-Transfer and Kinetic Effects, Journal of The Electrochemical Society, 147 (1) 176-188 (2000) The Electrochemical Society, Inc.) Used Only As Evidence.*
Bag, S.K.—5 Characterising Etching Processes in Bulk Micromachining—Dept. of Electronics and Communication Engineering, Vellore Institute of Technology, Tamilnadu, India—pp. 83-105.

(Continued)

*Primary Examiner* — Duy Deo
*Assistant Examiner* — Mahmoud Dahimene
(74) *Attorney, Agent, or Firm* — L. Jeffrey Kelly; Kenneth R. Corsello

(57) ABSTRACT

A method of preparing an etch solution and thinning semiconductor wafers using the etch solution is proposed. The method includes steps of creating a mixture of hydrofluoric acid, nitric acid, and acetic acid in a solution container in an approximate 1:3:5 ratio; causing the mixture to react with portions of one or more silicon wafers, the portions of the one or more silicon wafers are doped with boron in a level no less than $1\times10^{19}$ atoms/cm$^3$; collecting the mixture after reacting with the boron doped portions of the one or more silicon wafers; and adding collected mixture back into the solution container to create the etch solution.

18 Claims, 4 Drawing Sheets

(56) References Cited

OTHER PUBLICATIONS

Chen, Li—"A Novel MEMS Field Emission Accelerometer Based on Silicon Nanotips Array"—International Symposium on Photoelectronic and Imaging 2011—pp. Proc of SPIE vol. 8191 819127-1 thru 819127-8.

Kovacs, Gregory T. A.—"Bulk Micromachining of Silicon"—Proceedings of the IEEE, vol. 86, No. 8, Aug. 1998—pp. 1536-1551.
IBM: List of IBM Patents or Patent Applications Treated as Related (Appendix P), Dated Aug. 17, 2015 , 2 pages.
Pending U.S. Appl. No. 14/824,106, filed Aug. 12, 2015, entitled; "Selective Etching of Silicon Wafer", pp. 1-13.

* cited by examiner

SELECTIVE ETCHING OF SILICON WAFER

FIELD OF THE INVENTION

The present invention relates to the field of semiconductor device manufacturing. In particular, it relates to a method of etching silicon wafer, and to apparatus and solution used in or by the method.

BACKGROUND

State of art semiconductor device manufacturing technologies include, for example, deposition and etching techniques that are most commonly used to add material to or remove material from certain areas of a functional device structure, or a portion thereof, in a process of forming that device, be that material metallic, semiconductor, dielectric, or insulating material. For example, among the various etching techniques, processes using certain types of chemical solutions are widely used. In particular such processes, known as wet etching process or WETS, may be used in thinning semiconductor wafers in a three-dimensional (3-D) semiconductor device integration process.

Nevertheless, currently available WETS processes commonly used in thinning semiconductor wafers have individually their own shortfalls. For example, some wet etching processes may employ special chemical solutions including, for example, tetramethylammonium hydroxide (TMAH) solution, potassium hydroxide (KOH) solution, and ethylene diamine and pyrocatechol (EDP) solution but these processes generally have the property of anisotropic etching. In other words, their etch profiles depend on wafer crystallographic orientation i.e. (111), (110), etc., which as a result do not suit for wafer scale silicon removal.

On the other hand, some other wet etching processes that rely on a mixture solutions of for example $HF$—$HNO_3$—$H_2SO_4$, although being able to provide isotropic etch with high etch rate, have no doping selectivity and thus cannot provide adequate etch stop mechanism that may be required in order to control the etching process. In the meantime, although there are some other traditional wet etching processes but they generally have very low etch rate.

SUMMARY OF THE INVENTION

Embodiments of the present invention provide a method of preparing an etch solution, and using the etch solution in thinning semiconductor wafers. More specifically, the method includes creating a mixture of hydrofluoric acid, nitric acid, and acetic acid in a solution container in an approximate 1:3:5 ratio; causing the mixture to react with portions of one or more silicon wafers, the portions of the one or more silicon wafers are doped with boron in a level no less than $1\times10^{19}$ atoms/cm3; collecting the mixture after reacting with the boron doped portions of the one or more silicon wafers; and adding collected mixture back into the solution container to create the etch solution.

In one embodiment, the method further includes causing the collected mixture to react with portions of the one or more silicon wafers; and collecting the collected mixture and adding them back into the solution container.

According to one embodiment, causing the mixture to react with the portions of the one or more silicon wafers includes spraying the mixture onto the one or more silicon wafers and letting reacted mixture to drop into the solution container underneath thereof.

According to another embodiment, the one or more silicon wafers are suspended in an environmentally controlled space above the solution container.

In another embodiment, the method further includes adding a fresh mixture of hydrofluoric acid, nitric acid, and acetic acid into the solution container to sustain a stable etch rate, the added fresh mixture ranges 10~20% in volume of a total amount of solution in the solution container.

According to one embodiment, the portions of the one or more silicon wafers are one side of the silicon wafers that are heavily doped with boron.

One embodiment of present invention provides an apparatus that includes a solution bath of a seasoned solution, the seasoned solution containing a mixture of hydrofluoric acid, nitric acid, and acetic acid; and one or more silicon wafers being suspended in a position above the solution bath, wherein at least a portion of the mixture having been used in thinning the one or more silicon wafers.

BRIEF DESCRIPTION OF THE DRAWINGS

The invention will be understood and appreciated more fully from the following detailed description of preferred embodiments, taken in conjunction with the accompanying drawings of which.

Figure 1:
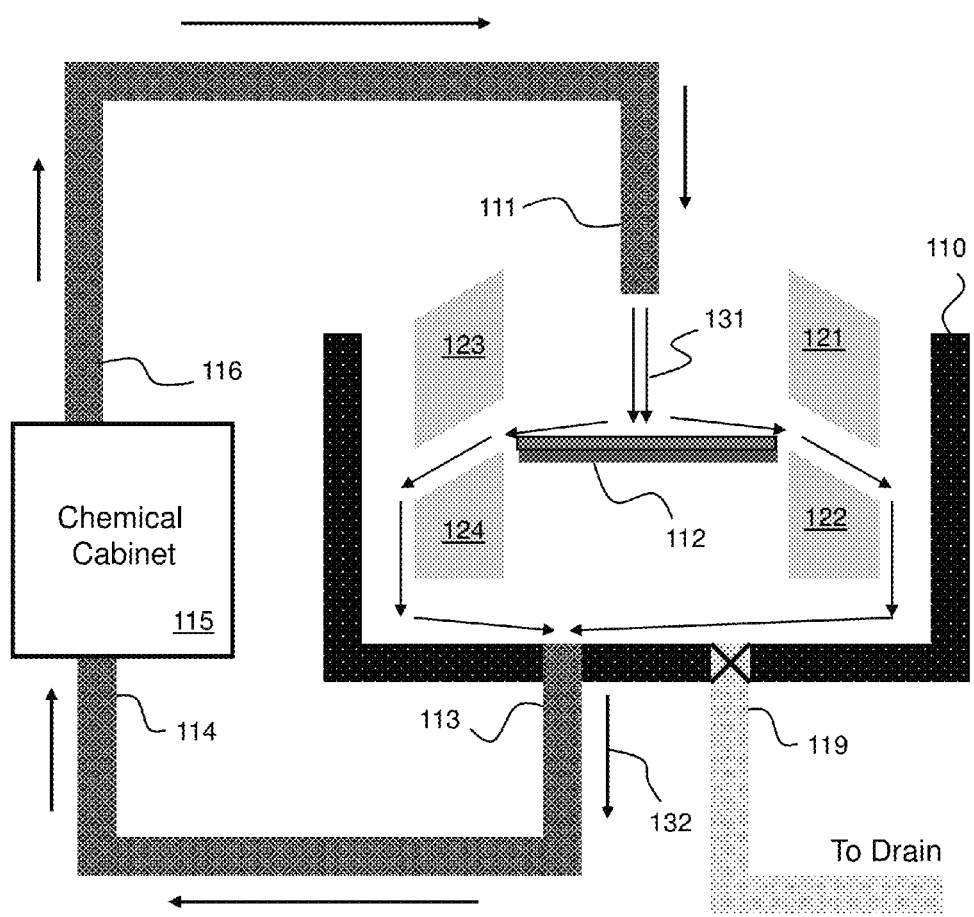
FIG. 1 is a demonstrative illustration of a method of wafer etching and an apparatus used therein having a solution re-circulation mechanism according to one embodiment of the present invention.

It will be appreciated that for the purpose of simplicity and clarity of illustration, elements in the drawings have not necessarily been drawn to scale. For example, dimensions of some of the elements may be exaggerated relative to other elements for clarity purpose.

DETAILED DESCRIPTION OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or patent applications for reference in order not to obscure description of essences and/or embodiments of the invention. It is to be understood that the following descriptions have rather focused on distinctive features and/or elements of various embodiments of the invention.
}

FIG. 1 is a demonstrative illustration of a method of semiconductor wafer etching as well as an apparatus used therein that has a solution re-circulation mechanism according to one embodiment of the present invention. More specifically, the apparatus may include at least a solution bath 110, at the bottom of which there may be a solution re-circulation port 113 and a drain port 119. During the use of solution bath 110 in etching/thinning semiconductor wafers, drain port 119 may be closed. Solutions collected by solution bath 110 after being used in the thinning of wafers (thus sometimes being referred to as waste solution or used solution) may be channeled via re-circulation port 113 into a chemical cabinet 115 through an input port 114 of the chemical cabinet 115. Coming out of an output port 116 of the chemical cabinet 115, the solutions, possibly with newly added chemicals from chemical cabinet 115, may be re-applied to the semiconductor wafers, such as wafers 121, 122, 123, and 124 that are inside solution bath 110 undergoing the thinning process. In some embodiment, new chemicals are periodically added in order to sustain a stable etch rate on silicon. As one example, the new chemical may simply be a fresh solution of what was originally in bath 110, which is then mixed with the used solution to maintain stable etch rate. When being added, the newly added fresh solution may be, for example, 10 to 20 vol. % of the total solution in solution bath 110.

According to one embodiment, during a wafer thinning process chemical solutions (such as one with hydrofluoric acid, nitric acid, and acetic acid known as HNA solution) may be re-circulated through ports 113, 114, 116 and chemical cabinet 115 to be re-applied to semiconductor wafers 121, 122, 123, and 124 through for example a spray nozzle 111 or any other solution outlet port. More specifically, as being demonstratively illustrated in FIG. 1, in one embodiment solution 131 coming out of nozzle 111 may be applied to a spinning platform 112. Spinning platform 112 may subsequently through its spinning motion spray or distribute solution 131, referred to herein as seasoned solution 131 after solution re-circulation, onto surrounding semiconductor wafers such as wafers 121, 122, 123, and 124 as being illustrated in FIG. 1. Other solution spraying or applying mechanism may be used as well. In one embodiments, semiconductor wafers 121, 122, 123, and 124 may be held to suspend in air or certain regulated or controlled environment such that solutions being applied to them may drip away from the wafers and into underneath solution bath 110 and re-collected by re-circulation port 113.

According to one embodiment, it is unexpectedly discovered that seasoned HNA solution 131 may contain a high level of concentration of nitride-oxide, NOx (for example NO or $NO_2$), provided uniquely by the wafer thinning process, which helps etch heavily doped semiconductor wafers and in particular heavily boron (B) doped silicon wafers. For example, after starting an etching process with solution re-circulation mechanism, when it reaches to about 10% of volume in the solution mixture coming from re-circulation, it has been observed that etch rate of heavily doped silicon wafer may reach a steady level of approximate 5 µm/min, with the wafer under thinning having a boron doped level of approximate $1 \times 10^{19}$ atoms/$cm^3$. This etch rate is confirmed to be more than 6 times faster than the about 0.8 µm/min etch rate being commonly observed in non-circulation (therefore non-seasoned) HNA solution.

Figure 2:
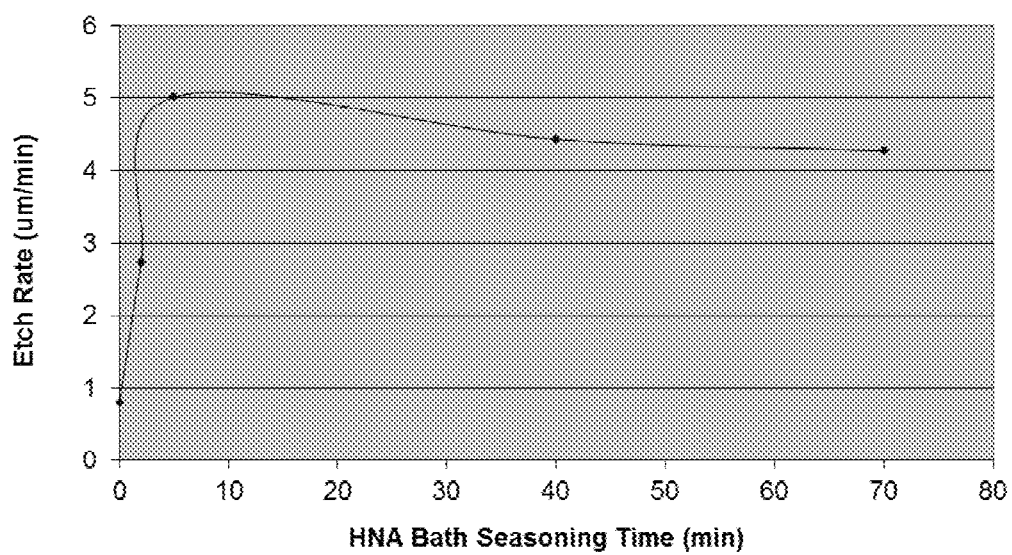
FIG. 2 is a sample experimental chart illustrating rapid etch rate change using solution re-circulation according to one embodiment of the present invention.

FIG. 2 is an exemplary sample experimental chart illustrating rapid etch rate increase with an HNA solution bath using solution re-circulation mechanism according to one embodiment of the present invention. In the chart illustrated in FIG. 2, x-axis denotes seasoning time of the HNA solution bath, expressed in minute. In other word, x-axis represents the time lapsed when HNA solution starts to be sprayed or applied onto heavily boron doped silicon wafers while in the meantime waste solution (or used solution) is being collected by solution bath 110 through re-circulation port 113 (FIG. 1) and re-applied to the silicon wafers. Y-axis denotes silicon wafer etch rate expressed in micrometer (µm) per minute. It is to be noted that the silicon wafer etch rate is only measured on one side of the wafer since the other side is not conditioned, such as heavily boron doped, to be etched.

In the chart shown in FIG. 2, it is clearly observed that the etch rate of silicon wafer increases dramatically within the initial approximate 5 minutes, starting at around 0.8 µm/min, which is the typical etch rate of silicon wafers in a non-seasoned HNA bath, to around 5 µm/min when the solution bath may be considered as being fully seasoned, that is, having at least 10 vol. % of re-circulated solution of the total solution volume in the solution bath. In other words, after approximately 5 minutes, the solution bath may be conditioned to become having sufficiently high level of NOx that in turn aids the etching of wafers that are heavily doped by p-type dopants such as boron. After approximately 5 minutes the etching rate, in the illustrated chart of experiment, tapers down slightly and eventually settles at around a steady level of about 4.2~4.3 µm/min. This tapering may partially be due to the solution in solution bath reaching equilibrium and is considered to be mainly caused by slight lag in reaching uniform mixture through solution recirculation. In a 3-D semiconductor device integration process, the etching or thinning process trims down the thickness of silicon wafer to a level that is desirable for the integration.

Figure 3A:
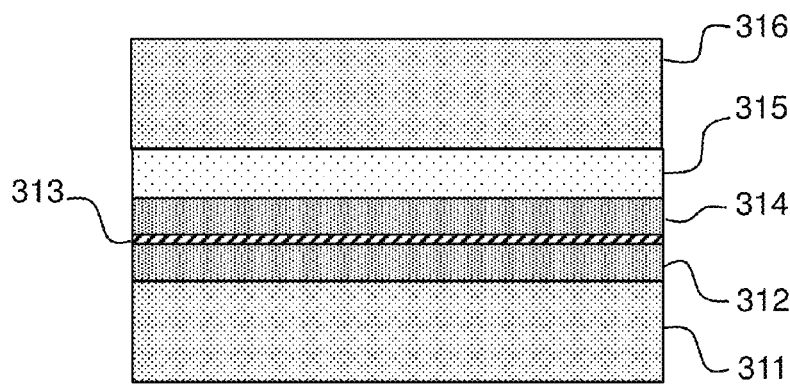
FIGS. 3A-3C are demonstrative illustrations of cross-sectional views of a wafer subjecting to a wafer thinning process according to one embodiment of the present invention.
Figure 3B:
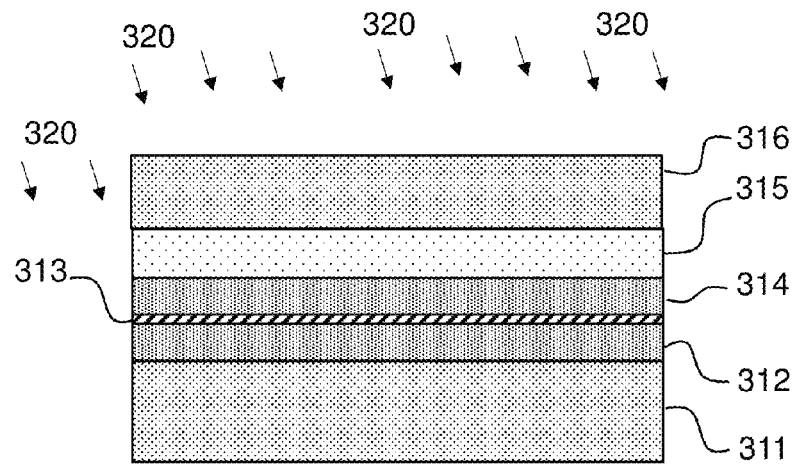
Figure 3C:
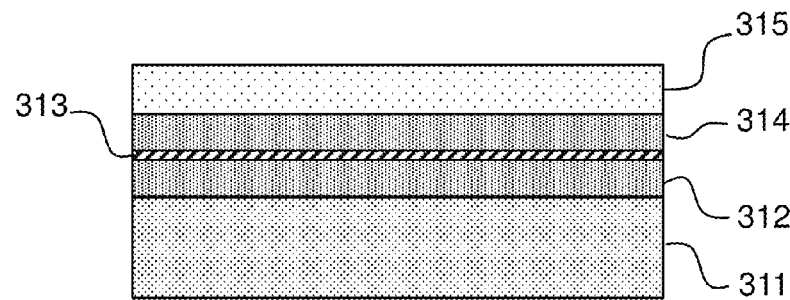

FIGS. 3A-3C are demonstrative illustrations of cross-sectional views of a semiconductor wafer being subjected to a wafer thinning process according to one embodiment of the present invention. For example, in a 3-D integration process of manufacturing semiconductor devices, embodiments of present invention may be applied in removing a handler substrate. More specifically as being illustrated demonstratively in FIG. 3A, during manufacturing, a first device layer 312 may be formed on a first substrate 311, and a second device layer 314 may be formed on a second substrate 316. Here, the second substrate 316 may be known as a handler substrate and may be heavily doped with boron (B). Device layer 314 may be formed on top of second substrate 316 or handler substrate via a lightly doped layer 315. Lightly doped layer 315 may be, for example, epitaxially grown on top of second substrate 316. In FIG. 3A, the second device layer 314 may be illustrated upside-down and be bonded together with the first device layer 312 through a bonding layer 313, which may be for example activated silicon oxide, silicon nitride, metal oxide hybrid bonding layer, polymeric adhesive materials, etc.

In one embodiment, the heavily doped handler substrate 316 may be doped with a dopant level of at least $1 \times 10^{19}$ atoms/$cm^3$, compared with the lightly doped layer 315 which may typically be doped at between about $1 \times 10^{15}$ $cm^{-3}$ and $1 \times 10^{16}$ atoms/$cm^3$ in dopant level. In other words, dopant level in handler substrate 316 may be at least 1000 times higher than that in layer 315. In a 3-D integration process, handler substrate 316 may be removed after integration. In removing handler substrate 316, according to one embodiment of present invention, a significant portion of handler substrate 316 may first be removed through a grinding or polishing process, which may rapidly reduce the thickness of handler substrate 316 to close to, for example, 10~12 µm. With a portion of handler substrate 316 (10~12 µm) still remaining on top of lightly doped layer 315, seasoned HNA solution may be applied or sprayed onto substrate 316, as being illustrated in FIG. 3B, which etches and removes the remaining portion of substrate 316. This wet etch process may slow down dramatically to stop at lightly doped layer 315 by virtue of the dopant level in layer 315. For example, layer 315 may be a p-type dopant (such as boron) doped silicon epitaxial layer with a dopant concentration level around approximately $1 \times 10^{15}$ to $1 \times 10^{16}$ atoms/cm$^3$, as being illustrated in FIG. 3C.

According to one embodiment, seasoned HNA solution may be prepared by first creating a mixture of chemical solution having HF:HNO$_3$:CH$_3$COOH in a ratio of approximate 1:3:5 in weight, although embodiment of present invention is not limited in this aspect and certain variation of the ratio of chemical components are acceptable and within the spirits of present invention. For example, ratio variation of above chemicals may range as follows: HF 1:HNO$_3$ 3~6: CH$_3$COOH 3~5 with HF being as a reference set at 1. It should be noted that other concentration variations outside the suggested range may be used as well, depending upon what the etch rate is desirable. In one embodiment, it is observed that etching and removing of a 12 μm thick substrate 316 took about 2.5 minutes, which is to be compared with the approximate 15 minutes that would otherwise be needed when a conventional, unseasoned HNA solution is used as the best-known method (BKM) process. For clarification, the 2.5 minutes does not include any additional time for wafer handling and rinsing.

Figure 4:
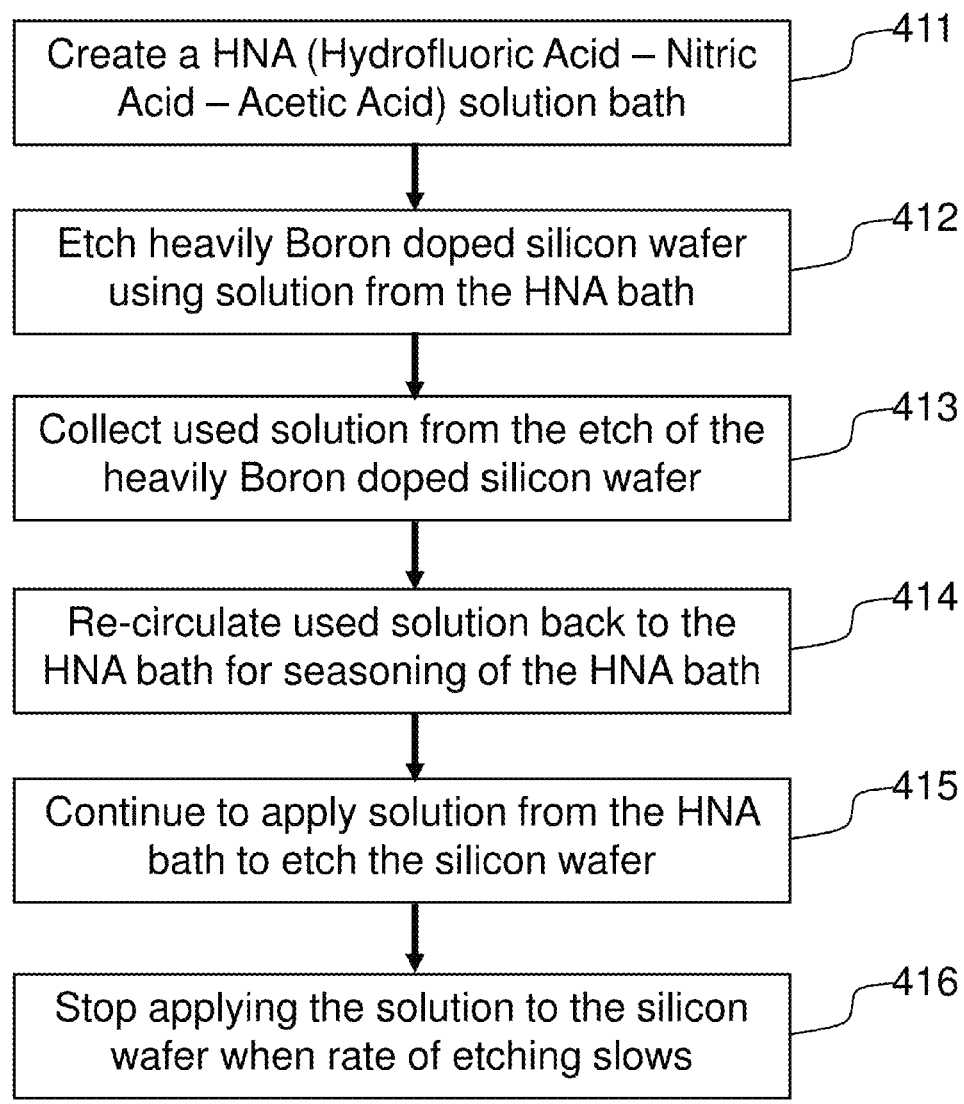
FIG. 4 is a simplified flow-chart illustration of applying a solution re-circulation mechanism in a wafer etching process, according to one embodiment of the present invention.

FIG. 4 is a simplified flow-chart illustration of a method of creating a seasoned solution using re-circulation mechanism and applying the seasoned solution in a wafer thinning process, according to one embodiment of present invention. More specifically, one embodiment of a method of present invention may include steps of first creating a HNA solution bath at step 411, by mixing hydrofluoric acid, nitric acid, and acetic acid in a pre-determined mix ratio such as a ratio of about 1:3:5, although slightly higher or lower content (within for example 5% relative to others) of each acid are fully contemplated by present embodiment as well. In each of the mixing chemical solutions, water is an integral part and concentration of the chemicals may be, for example, HF 49 wt. %, nitric acid 70 wt. % and acetic acid 98 wt. % respectively. After the creation of the solution additional water may be added depending on the intended application, although not necessarily needed, with the effect of dilution where adding water generally will lower the etch rate. Next at step 412, the prepared mixture of chemical solution may be applied, such as through a spray-on process, onto heavily doped (such as heavily boron doped) silicon wafers and in particular to the side (or sides) of the silicon wafers that are boron doped for the purpose of etching and/or thinning thereof. Solution coming off these wafers, known as waste solution or used solution, may then be collected at step 413 by using for example a solution bath, and subsequently re-circulated back to be applied to the wafers and re-collected by the solution bath at step 414 to create seasoned bath solution. After a certain number of re-circulation, the solution may become seasoned solution to contain a desired level of NOx (such as NO or NO$_2$), that is discovered to be advantageous to the etching of wafers, and the seasoned solution may be re-used and re-applied to the silicon wafer for further thinning the substrate at step 415. In the seasoned solution, the level of NOx may be proportional to the concentration of HNO$_3$ and in approximate 1:1~2 molar ratio. Once most of the heavily doped portions of silicon is etched away and underneath lightly doped (less than $1 \times 10^{15}$ atoms/cm$^3$) portion of wafer is exposed, the etching rate may significantly slow down to close to zero at which point the wafer thinning process may be considered as accomplished.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
    forming a mixture of hydrofluoric acid, nitric acid, and acetic acid in an approximate 1:3:5 weight ratio;
    forming a used solution by causing a first portion of the mixture to react with portions of one or more silicon wafers, the portions of the one or more silicon wafers are doped with boron at a level no less than $1 \times 10^{19}$ atoms/cm$^3$; and
    circulating the used solution until a molar ratio between NO$_2$ and nitric acid is approximately 1:2 to 1:1, the circulating comprising repeating the following sequence of steps:
        mixing the used solution with a second portion of the mixture at a volume ratio of at least 1 part used solution to 9 parts second portion of the mixture; and
        causing the used solution to react with the portions of the one or more silicon wafers.

2. The method of claim 1, wherein causing a first portion of the mixture to react with portions of one or more silicon wafers comprises spraying the first portion of the mixture out of a nozzle onto a spinning platform where the spinning platform sprays the first portion of the mixture onto the one or more silicon wafers and letting the first portion of the mixture drop into a solution container; and
    wherein causing the used solution to react with the portions of the one or more silicon wafers comprises spraying the used solution out of a nozzle onto a spinning platform where the spinning platform sprays or distributes the used solution onto the one or more silicon wafers and letting the used solution drop into the solution container.

3. The method of claim 1, wherein the one or more silicon wafers are suspended in an environmentally controlled space.

4. The method of claim 1, wherein the portions of the one or more silicon wafers are one side of the one or more silicon wafers that are heavily doped with boron.

5. The method of claim 1, wherein a second portion of the one or more silicon wafers are doped with boron in a level less than $1 \times 10^{16}$ atoms/cm$^3$, wherein the seasoned etch solution etches the second portion of the one or more silicon wafers at a rate approximately zero.

6. The method of claim 1, wherein the seasoned etch solution etches the portions of the one or more silicon wafers approximately six times faster than the mixture.

7. A method of preparing a seasoned etch solution comprising:
    forming an etch solution of hydrofluoric acid, nitric acid, and acetic acid in a solution container in an approximate 1:3:5 weight ratio;
    forming the seasoned etch solution by causing a first portion of the etch solution to react with portions of one or more silicon wafers, the portions of the one or more silicon wafers are doped with boron at a level no less than $1 \times 10^{19}$ atoms/cm$^3$;
    mixing the seasoned etch solution with a second portion of the etch solution at a volume ratio of at least 1 part seasoned solution to 9 parts second portion of the mixture; and causing the seasoned etch solution to react with the portions of one or more silicon wafers after mixing it with the second portion of the etch solution;

circulating the seasoned etch solution until a molar ratio between $NO_2$ and nitric acid is approximately 1:2 to 1:1, the circulating comprising repeating both mixing the seasoned etch solution with the second portion of the etch solution and causing the seasoned etch solution to react with the portions of the one or more silicon wafers.

8. The method of claim 7, wherein the seasoned etch solution etches the portions of the one or more silicon wafers approximately six times faster than the seasoned etch solution.

9. The method of claim 7, wherein causing the etch solution to react with the portions of the one or more silicon wafers comprises spraying the mixture out of a nozzle onto a spinning platform where the spinning platform sprays the mixture onto the one or more silicon wafers and letting the reacted mixture drop into the solution container underneath.

10. The method of claim 7, wherein the one or more silicon wafers are suspended in an environmentally controlled space above the solution container.

11. The method of claim 7, wherein the portions of the one or more silicon wafers are one side of the one or more silicon wafers that are heavily doped with boron.

12. The method of claim 7, wherein a second portion of the one or more silicon wafers are doped with boron in a level less than $1\times10^{16}$ atoms/cm$^3$, wherein the seasoned etch solution etches the second portion of the one or more silicon wafers at a rate approximately zero.

13. A method of preparing an etch solution comprising:
forming an etch solution of hydrofluoric acid, nitric acid, and acetic acid in an approximate 1:3:5 weight ratio; and
circulating the etch solution until a molar ratio between $NO_2$ and nitric acid is approximately 1:2 to 1:1, the circulating comprising repeating the following sequence of steps:
causing the etch solution to react with portions of one or more silicon wafers, wherein the portions of the one or more silicon wafers are doped with boron at a level no less than $1\times10^{19}$ atoms/cm$^3$; and
mixing 1 part etch solution to 9 parts fresh solution, the fresh solution comprises hydrofluoric acid, nitric acid, and acetic acid in an approximate 1:3:5 weight ratio.

14. The method of claim 13, wherein the etch solution etches the portions of the one or more silicon wafers approximately six times faster than the fresh solution.

15. The method of claim 13, wherein causing the etch solution to react with the portions of the one or more silicon wafers comprises spraying the mixture out of a nozzle onto a spinning platform where the spinning platform sprays the mixture onto the one or more silicon wafers and letting the reacted mixture drop into a solution container underneath.

16. The method of claim 13, wherein the one or more silicon wafers are suspended in an environmentally controlled space.

17. The method of claim 13, wherein the portions of the one or more silicon wafers are one side of the one or more silicon wafers that are heavily doped with boron.

18. The method of claim 13, wherein a second portion of the one or more silicon wafers are doped with boron in a level less than $1\times10^{16}$ atoms/cm$^3$, and wherein the etch solution etches the second portion of the one or more silicon wafers at a rate approximately zero.

* * * * *